United States Patent [19]

Schwartz et al.

[11] 4,036,723
[45] July 19, 1977

[54] RF BIAS SPUTTERING METHOD FOR PRODUCING INSULATING FILMS FREE OF SURFACE IRREGULARITIES

[75] Inventors: Bradford Clyde Schwartz; Ralph Donald Silkensen; Gerald Steving, all of Longmont, Colo.

[73] Assignee: International Business Machines Corporation, Armonk, N.Y.

[21] Appl. No.: 691,917

[22] Filed: June 1, 1976

Related U.S. Application Data

[63] Continuation-in-part of Ser. No. 606,692, Aug. 21, 1975, abandoned.

[51] Int. Cl.² ................................................ C23C 15/00
[52] U.S. Cl. ............................... 204/192 EC; 360/113
[58] Field of Search .................. 204/192 ID, 192 EC

[56] References Cited

U.S. PATENT DOCUMENTS 3,983,022  9/1976  Auyang .................................. 204/192

*Primary Examiner*—John H. Mack
*Assistant Examiner*—Aaron Weisstuch
*Attorney, Agent, or Firm*—William N. Hogg

[57] ABSTRACT

An insulating film substantially free from surface irregularities is RF bias sputtered onto a smooth polycrystalline or micro-roughened surface. Controlled sputtering is performed first at a low reemission coefficient and then, after a substantially continuous layer of insulative amorphous film is deposited over the substrate, increasing the reemission coefficient to a second higher level. A low reemission coefficient is about 0.25 and a high coefficient is about 0.7.

22 Claims, No Drawings

RF BIAS SPUTTERING METHOD FOR PRODUCING INSULATING FILMS FREE OF SURFACE IRREGULARITIES

This is a continuation-in-part of copending application Ser. No. 606,692, filed Aug. 21, 1975, now abandoned.

BACKGROUND OF THE INVENTION

The present invention relates to methods of RF bias sputtering and, more particularly, to methods of resputtering layers of electrically insulative material used in thin film fabrication operations. More specifically, it relates to the construction of thin film magnetic heads or integrated semiconductor circuits, wherein a passivating or insulating film or layer is RF bias sputter deposited over a polycrystalline or micro-roughened substrate.

The phenomenon of RF bias sputtering or resputtering, in general, is known in the art and involves the reemission of deposited insulative material during the sputter deposition thereof through the effects of attendant ion bombardment of the deposited insulative layer. Apparatus for providing this resputtering characteristic is believed to have been first disclosed in the publication, "Thin Films Deposited by Bias Sputtering," L. I. Maissel, et al, JOURNAL OF APPLIED PHYSICS, January, 1965, p. 237, as a modified DC sputtering technique known as "biased sputtering." The application of the principles of resputtering to RF sputtering is disclosed in an article, "Re-emission Coefficients of Silicon and Silicon Dioxide Films Deposited Through RF and DC Sputtering," R. E. Jones, et al, JOURNAL OF APPLIED PHYSICS, November, 1967, p. 4656, and "Re-emission of Sputtered $SiO_2$ During Growth and Its Relation to Film Quality," L. I. Maissel, et al, IBM JOURNAL OF RESEARCH AND DEVELOPMENT, March, 1970, p. 176. In effect, resputtering is the positive ion bombardment of a substrate or deposited film during its deposition. Therefore, during RF bias sputtering, there is always simultaneous etching and deposition. The prior art has recognized that RF bias sputtering improves film quality and uniformity, as set forth, for example, in U.S. Pat. No. 3,661,761. The use of sputtering to partially planarize electrical insulative films grossly distorted by underlying integrated circuit lines is taught in U.S. Pat. No. 3,804,738. The use of resputtering to totally remove all elevations from a deposited insulative layer to completely planarize the surface of the layer is taught in copending patent application Ser. No. 512,781, now U.S. Pat. No. 3,983,022, assigned to the same assignee as the present application. In this copending application, silicon dioxide is sputtered onto a metal stripe employing a relatively low amount of resputtering initially and, subsequently, the resputtering is substantially increased. The specific quantitative relationships are not given.

While resputtering has been used to some extent in the fabrication of thin film magnetic heads and integrated circuits, either solely as a deposition technique, for the purpose of improving the quality of sputter deposited films, or for complete or partial planarization of grossly distorted films due to underlying structures, resputtering is not known to have been utilized on polycrystalline or microroughened substrates in a manner which provides a thin insulative film which substantially avoids surface irregularities due to the preferential etching of crystal boundaries or defects on the substrate.

As already noted during RF bias sputtering, there is always simultaneous deposition and etching at the substrate. It has been discovered that polycrystalline ceramic substrates tend to preferentially etch and enlarge their grain boundaries during RF bias sputtering of insulative materials. This causes the substrate to be roughened by deepening and widening the grain boundaries. Subsequently, as the insulative film builds up on the now preferentially etched substrate, the film surface carries substantially the same contours as the preferentially etched substrate and thus may be less smooth than the initial substrate prior to the initiation of RF bias sputtering. The problem of preferential etching is not found to be avoided by polishing of polycrystalline material prior to RF bias sputtering as the micro-smoothness of the substrate does not protect the grain boundaries of polycrystalline ceramic substrate material from being preferentially etched and transmitting itself through the insulative coating. Similarly, micro-roughness or scratches, on the order of 500 A and less on any substrate, whether amorphous, single crystal or polycrystalline, tends to provide a location for preferential etching during RF bias sputtering. Such preferential etching due to micro-roughness also transmits itself upon the surface of the deposited coating. As used herein, the term microroughness includes any surface irregularity or scratch in the range of 100–500 A.

Insulative coating may have an effect on subsequently deposited material, and especially on the magnetic properties of subsequently deposited thin magnetic films. It is, therefore, desirable that the grain boundaries or defects in the substrate not transmit themselves on the surface of the deposited insulative material, or even worse, that the grain boundaries and defects not be enlarged so as to increase their effect on the insulative coating due to the natural tendency during RF bias sputtering to preferentially etch along grain boundaries and surface defects.

SUMMARY OF THE INVENTION

Accordingly, it is a primary object of the present invention to provide a method for providing an insulative layer on a substantially flat smooth polycrystalline or micro-roughened substrate, in such a manner that the surface of the deposited insulative layer is as smooth or smoother than the initial substrate.

It is another object of the present invention to provide a method for providing insulative layers having extremely smooth surfaces on polycrystalline or microroughened substrates, which method utilizes RF bias sputtering at a first low reemission coefficient followed by additional sputtering at a higher reemission coefficient after the substrate is substantially completely coated with amorphous insulative material.

It is a further object of the present invention to provide a method for RF bias sputtering insulative material onto a polycrystalline or micro-roughened substrate without substantial initial preferential etching of crystal grain boundaries or micro-roughened portions of the substrate.

It is yet a further object of the present invention to provide a magnetic member having improved magnetic characteristics, which member is deposited on the smooth surface of an RF bias sputtered layer produced in accordance with the present invention.

The present invention provides a method of forming an electrically insulative layer over a polycrystalline or micro-roughened substrate, comprising the steps of subjecting said substrate to RF bias sputtering at an initial low reemission coefficient, and then, after a substantially continuous layer of amorphous insulative material is provided upon the substrate, increasing the reemission coefficient to a higher level. Specific power ratios and related reemission coefficients have been found to give especially desirable results. Initial deposition may utilize reemission coefficients between 0.15 to 0.35 with the preferred embodiment being 0.25. Subsequent sputtering at the higher reemission coefficient may be at any coefficient greater than about 0.6. However, it is art known and preferred to resputter at a reemission coefficient in the range of 0.65 to 0.75 to provide a smooth insulative film surface. As used herein, and described in the referenced L. I. Maissel, et al, article, a reemission coefficient of 0.2, for example, indicates that about 20% of the total film deposited is reemitted due to thermal action and ion bombardment. Similarly, a reemission coefficient of 0.7 indicates that 70% of the total deposition is reemitted, leaving only 30% upon the substrate surfaces, and so on.

In carrying out this process, the to-be-coated substrate requires no special location or orientation within the sputtering apparatus. The preparation of the smooth insulative layer over the polycrystalline or micro-roughened substrate is based upon the initial selection of the resputtering characteristic to a low emission coefficient which provides little or no preferential etching along grain boundaries and defects until the substrate is substantially coated with a continuous amorphous insulative layer having a surface which substantially transmits the surface characteristics of the substrate, while the subsequent deposition at a higher reemission coefficient has no effect upon the substrate and encourages the smoothing of the surface of the deposited insulative layer by art known resputtering techniques. However, without both steps, the smooth, final insulative surface could not be produced on polycrystalline or micro-roughened substrates.

The foregoing and other objects, features, and advantages of the invention will be apparent from the following more particular description and the preferred embodiments of the invention.

DESCRIPTION OF THE PREFERRED EMBODIMENT

In the operation of this invention, the process may be applied to place one or more layers of insulative material on any polycrystalline substrate material which may in turn carry layers of other materials. It is applicable to polycrystalline ceramics and specifically to ferrite substrates. It is also applicable to polycrystalline metals. The process is also used for deposition of smooth films on single crystal or amorphous substrates which include surface defects of up to about 500 A. The RF bias sputtered insulative material may be any material capable of being initially deposited in an amorphous condition at a low reemission coefficient such as aluminum oxide ($Al_2O_3$), silicon dioxide ($SiO_2$), or silicon nitride ($Si_3N_4$), for example. While the use of these materials in conjunction with magnetic head formation is known, the present process can be applied to the fabrication of any miniature device. Other details of fabrication of such miniature devices are well known in the art and are not limiting upon the present invention.

The method of the present invention which eliminates preferential etching of grain boundaries or defects in the substrate will now be described in additional detail. The substrate which is utilized for deposition is assumed to be generally flat and to have been prepared in accordance with standard fabrication techniques. This method initially involves locating the prepared substrate within the RF bias sputtering apparatus. The initial structure may be either a monolithic substrate or a substrate on which some fabrication processes have been previously carried out. The only requirement for the practice of the present invention is that the polycrystalline or micro-roughened surface which is to be coated with a smooth layer of insulative material is substantially smooth, within about 500 A, in some area which is to be coated with insulative material according to the process of the present invention. Then, in accordance with one embodiment of the present invention, $Al_2O_3$, for example, is RF bias sputtered onto a ferrite substrate using a reemission coefficient of 0.25, thus avoiding preferential etching of the substrate, to a thickness of about at least 500 A and for as much as about one-third of the thickness of the to-be-deposited insulative layer. Subsequently, coating is continued at a higher reemission coefficient of about 0.7 to produce a smooth surface having a smoothness value of 250 A or less peak to valley.

These processes are carried out utilizing conventional RF bias sputtering equipment to deposit the insulative material. This equipment is capable of being initially adjusted to a low reemission coefficient of about 0.2 so that there is little reemission or removal of the substrate or insulative material from the layer being deposited, so that the cycle is primarily one of deposition only with little or not preferential etching of the substrate.

Apparatus suitable for this process is described in the IBM TECHNICAL DISCLOSURE BULLETIN, September, 1971, p. 1032, in the article "Power Network for Substrate," R. P. Auyang, et al. Typical commercial apparatus is the Model 3176 RF Sputtering System manufactured by the NRC Division of Varian. In the RF sputtering system shown in the publication, there is a power splitting circuit for a driven RF system with independent controls for resputtering power and for the electrical phase between the target cathode and the substrate holder anode. In such a system, an RF generator supplies power to a cathode supporting a target of insulative material to be deposited on the substrate supported on the anode. In standard operation, the target, substrate, and their associated electrodes are contained in a vacuum chamber. A coupling capacitor having a magnitude of from 50 to 250 pF is included, which permits adjustment of the power splitting during operation. The substrate holder/anode is driven by a matched 50 ohm transmission cable. A lower matching network transforms the input impedance of the substrate electrode to a 50 ohm load so that the connecting cable functions as a delay line. The electrical phase between the target electrode and the substrate electrode is adjusted for desired resputtering ratios by selecting the appropriate length for the delay cable. Because the cable is matched, the effect of resputtering is easily monitored by forward and reflected power meters connected to the cable as well as by controlling the DC bias on the substrate electrode. In this arrangement, the chamber walls act as though they were a third electrode which is grounded so that the apparatus is, in effect, a driven substrate system with a three electrode arrangement. In preferred embodiments, the substrate is placed on a metallic plate of low sputter yield material, which plate covers the face of the anode. This metallic plate provides a thermal conductor between the substrate and the electrode. In preferred embodiments, the substrate electrode is also water cooled. The cooling effect of the metal plate and water cooled electrode, combined with low power density during the initial deposition cycle, tends to assist in providing the deposited insulative material in an amorphous form.

In one preferred embodiment, the previously referenced commercial apparatus may be operated under the following initial average conditions until the subtrate is coated with a substantially continuous layer of insulative material: total power 0.70 kw; substrate anode power 0.04 kw; target cathode 0.66 kw; chamber argon pressure 12 microns of Hg; delay line length 12.5 feet; and spacing between electrodes 1.0 inch. After the initial deposition of amorphous insulative material, the resputtering ratio is then increased so that the target cathode is operated at 0.47 kw and the substrate anode is operated at 0.23 kw. Operating under the conditions described and utilizing a substrate which is polycrystalline or includes defects or micro-roughness of up to about 500 A, an insulative layer with excellent smoothness value of 250 A or less peak to valley can be provided with an initial insulative layer of at least 500 A and with the thickness of the final insulative layer of material about 1500 to 2000 A, for example. Under these conditions, it has been found that the rate of deposition of insulative material at the initial low reemission coefficient is about 37 to 43 A/minute, with 40 A/minute preferred. The rate of deposition at the second or higher reemission coefficient is about 27 to 33 A/minute. With increasing sputtering power, there is an initial rate increase with negligible rise in wafer temperature. This can be explained by the increase in ionization efficiency due to increasing the anode power. Thus, the initial deposition to a thickness of about at least 500 A can be completed in about 12 to 14 minutes. Insulation deposition at the higher emission coefficient is somewhat slower, but a thickness of about 1000 A can be achieved in about 30 to 37 minutes. Thus, to achieve a total thickness of 1500 A requires a total actual deposition time of less than 1 hour.

In accordance with the present invention, the surface of the deposited insulative material, after the second sputtering step, is found to be as smooth or smoother than the initial substrate, with peak to valley smoothness value of 250 A or less peak to valley as measured using CLA techniques. The achievement of such excellent smoothness in such a short period of time is beneficial both as providing a high degree of general utility and for providing a surface for subsequent deposition of magnetic materials exhibiting excellent magnetic characteristics in a magnetic head.

For example, the present invention is useful in the production of magnetic heads of the type described in U.S. Pat. Nos. 3,860,965 and 3,881,190. In embodiments disclosed in those references, head structures are produced utilizing ferrite as a substrate on which insulative layers are deposited. Subsequently, a magnetic film, for example a magnetoresistive film, is deposited on the insulative layer. As will be set forth in more detail hereinafter, the magnetic characteristics of deposited magnetoresistive films is best realized if several magnetic characteristics of the film are optimized. These magnetic characteristics are best achieved when the magnetic film is deposited on a very smooth surface such as a smooth insulative coating. It has been found that where the insulative coating is deposited in a single step by standard RF bias sputtering with a high reemission coefficient such as 0.7, the magnetic characteristics are deficient. However, when the two step method of the present invention, using a first low reemission coefficient followed by a higher reemission coefficient is utilized, smoother insulative surfaces are provided so that magnetic films which are subsequently deposited have superior magnetoresistive and other magnetic characteristics.

Typical exemplary deposition and photolithographic techniques for producing such heads are set forth in the above noted U.S. Pat. Nos. 3,860,965 and 3,881,190. The method of the present invention can easily be utilized in providing insulative layers in other magnetic head structures and in integrated circuits.

In one specific head manufacturing application, Al$_2$O$_3$ was deposited on a polished polycrystalline ferrite in accordance with the teaching of the present invention and then a layer, such as a raised line pattern, of magnetoresistive permalloy was deposited on the surface of the resulting insulative layer. In a deposition system of the type already described, the RF power supply was 13.56 MHz rated at 5 kw. A driven substrate system with 16 inch diameter electrodes was utilized. Using a power density of 0.54 watts/cm$^2$, a first layer of about 900 A thickness was deposited utilizing a target cathode power of 0.66 kw and a substrate anode power of 0.04 kw, or a reemission coefficient of 0.25. Subsequently, an additional second Al$_2$O$_3$ layer about 2000 A thick was deposited utilizing a higher reemission coefficient of about 0.7, with 0.47 kw at the target cathode and 0.23 kw at the substrate anode. CLA examination indicated that after the second deposition, the surface of the deposited Al$_2$O$_3$ had a peak-to-valley smoothness value of 250 A or less, the lowest peak-to-valley measurement the CLA system was capable of determining. Then, a magnetoresistive permalloy film 400 A was vacuum deposited on the insulative Al$_2$O$_3$ surface. The magnetic characteristics of the resulting permalloy film are set forth in Example 1 in TABLE I below. In the Table, "H$_{ce}$ less than or equal to about 1.5 oe" designates "easy axis coercivity;" a low H$_{ce}$ is desirable for soft magnetic films. "H$_k$" designates "anisotropy" and is desired to be within a range of about 2.5 to 5.5 oe. In a similar manner, "H$_{ch}$" designates "hard axis coercivity" and should be less than or equal to about 1.5 oe. "$\beta$" is indicative of "skew", while $\alpha$ is dispersion. $\beta$ should be less than or equal to 5°, where $\alpha$ is preferably less than or equal to 10°. These magnetic film specifications have been found necessary to provide good MR sensors with permalloy films of 400 A thickness. Desirable features include adequate response to external magnetic fields and minimal Barkhausen noise. Subsequently, this subassembly was completed by forming conductive connections to said permalloy, coating said permalloy and conductive connections with insulation and placing additional ferrite on the insulation to form a magnetic head, and, as described in U.S. Pat. No. 3,881,190, was found to be an excellent, functional magnetic head.

For purposes of comparison, a similar polished ferrite substrate was coated with Al$_2$O$_3$ in a single step to the same total thickness utilizing a low reemission coefficient of about 0.25, with a cathode power of 0.66 kw and 0.04 kw anode power. CLA measurement indicated that the surface of the one step deposited Al$_2$O$_3$ had a peak-to-valley smoothness value substantially greater than 250 A. The resulting insulative film was then vacuum coated with 400 A of permalloy in the same manner as in Example 1. The results of this control experiment are shown in TABLE I as Example 2. The magnetic characteristics of deposited permalloy produced on the roughened Al₂O₃ surface of Example 2, using only a single step low reemission coefficient during deposition, can be seen to provide magnetic films which are deficient when compared with the magnetic characteristics of the permalloy in Example 1 deposited on the smoother insulative layer produced in accordance with the two step process of the present invention. It is thus seen that a low reemission coefficient is not by itself sufficient to provide a smooth surface.

TABLE I

| Substrate and Process | | $H_{ce}$ | $H_k$ | $H_{ch}$ | $\beta$ | $\alpha$ |
|---|---|---|---|---|---|---|
| Example 1: | Polish ferrite with Al₂O₃ layer by two step process | 1.4 oe | 3.7 oe | 0.5 oe | 3° | 4° |
| Example 2: | Polish ferrite with Al₂O₃ layer by one step process | 3.6 oe | 6.8 oe | 0.5 oe | 5° | 8° |

In both Examples 1 and 2, the magnetic data was obtained by magneto-optic techniques.

In a similar manner, in the preparation of a magnetoresistive head of the type set forth in U.S. Pat. No. 3,860,965, the teaching of the present invention was applied to the deposition of insulative material between a first permalloy layer and a second permalloy layer. In the application of the present invention to that structure, a total power input of 0.70 kw was applied to the 16 inch diameter electrodes. In the first step, about 500 A of Al₂O₃ was deposited, with an applied cathode power of 0.66 kw and an applied anode power of 0.04 kw or a reemission coefficient of about 0.25. Subsequently, an additional 600 to 1000 A of Al₂O₃ was deposited, with a cathode power of 0.47 kw and anode power of 0.23 kw or a reemission coefficient of about 0.7. Then, a second permalloy film of 400 A thickness was vacuum deposited on the Al₂O₃. This process was repeated in several examples and was found to produce Al₂O₃ surfaces having a CLA of less than 250 A in a highly reproducible manner. The magnetic characteristics of the permalloy deposited on the smooth Al₂O₃ surfaces are set forth in TABLE II as Examples 3–8.

For purposes of comparison, Examples 9 and 10 were produced by depositing Al₂O₃ in accordance with "standard" high reemission coefficient techniques and without the utilization of an initial layer at low reemission coefficient. CLA measurement indicated that the surface of the one step deposited Al₂O₃ had a peak-to-valley smoothness value substantially greater than 250 A. As with Examples 3–8, the resulting Al₂O₃ film was then coated with permalloy. The magnetic characteristics of the permalloy deposited on the Al₂O₃, deposited by a standard technique, are also set forth in TABLE II as Examples 9 and 10. Again, it is seen that the magnetic films deposited on an insulative surface produced in accordance with the present two step invention are superior in character to the magnetic films produced on insulative material in accordance with the standard prior art one step high re-emission coefficient technique.

Table III sumarizes standard experimental results, obtained with a modified version of the previously identified commercial equipment, demonstrating the well known and conventionally determinable relationship between the sputtering-to-resputtering power ratio and the reemission coefficient $\rho$.

TABLE II

| Process | | $H_{ce}$ | $H_k$ | $H_{ch}$ | $\beta$ | $\alpha$ |
|---|---|---|---|---|---|---|
| Example 3: | Two Step | 1.6 oe | 4.1 oe | 0.9 oe | 1° | 4° |
| Example 4: | Two Step | 2.1 oe | 4.7 oe | 0.9 oe | 2° | 4° |
| Example 5: | Two Step | 1.8 oe | 4.1 oe | 1.3 oe | 1.5° | 7° |
| Example 6: | Two Step | 1.5 oe | 3.5 oe | 0.8 oe | 3.5° | 4° |
| Example 7: | Two Step | 2.0 oe | 4.6 oe | 1.4 oe | 27°* | 8° |
| Example 8: | Two Step | 1.3 oe | 4.0 oe | 1.0 oe | 2° | 4° |
| Example 9: | One Step | 3.4 oe | 3.9 oe | 2.7 oe | 49°* | 11° |
| Example 10: | One Step | 4.9 oe | 8.6 oe | 1.8 oe | 4° | 7° |

*Skewed deliberately during deposition.

TABLE III

| Power Ratio | −DC Volts | I | A | $\rho$ |
|---|---|---|---|---|
| 35/1 | 15 | 3.34 | 2.84 | 0.15 |
| 17/1 | 45 | 3.45 | 2.59 | 0.25 |
| 12/1 | 55 | 2.85 | 1.84 | 0.35 |
| 5/1 | 80 | 2.56 | 1.02 | 0.6 |
| 2/1 | 120 | 1.68 | 0.50 | 0.7 |
| 1.5/1 | 140 | 2.02 | 0.40 | 0.8 |

I = Weight of Al₂O₃ in can (thin hole of area 0.003 in²) multiply by 326 for wt/in² - milligrams weight
A = Weight of Al₂O₃ deposited on 1.0″ square plate
$\rho$ = Re-emission Coefficient = $\frac{(I - A)}{I}$ Other changes and modifications of the present invention will be apparent to one skilled in the art. Variations in total power or electrode sizes will not substantially effect the practice of the present invention. Similarly, neither electrode spacing nor gas pressure, if reasonably balanced for a normal system as is known in the art, will effect the application of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the method of forming an electrically insulative coating having a surface smoothness value of 250 A or less, peak to valley, over a polycrystalline or a microroughened substrate having surface irregularities of as great as 500 A, the steps of:
   RF bias sputtering a first substantially continuous layer of electrically insulative material over said substrate at a reemission coefficient of about 0.35 or lower; and then
   RF bias sputtering a second layer of said electrically insulative material over said first layer of electrically insulative material at a reemission coefficient of about 0.6 or greater to provide a surface smoothness of at least about 250 A, peak to valley, or smoother.

2. The method of claim 1 wherein said polycrystalline substrate is a ceramic.

3. The method of claim 2 wherein said ceramic is ferrite.

4. The method of claim 1 wherein said electrically insulative material is amorphous.

5. The method of claim 4 wherein said electrically insulative material selected from the group consisting of Al₂O₃, SiO₂, and Si₃N₄.

6. The method of claim 4 wherein sputtering of said first electrically insulative layer is at a reemission coefficient in the range of about 0.15 to 0.35.

7. The method of claim 1 wherein said electrically insulative material is selected from the group consisting of Al₂O₃, SiO₂, and Si₃N₄.

8. The method of claim 7 wherein said second insulative layer is sputtered at a reemission coefficient in the range of about 0.6 to 0.8.

9. The method of claim 1 wherein said first electrically insulative layer is sputtered at a reemission coefficient of about 0.15 to 0.35.

10. The method of claim 1 wherein said first insulative layer is sputtered at a reemission coefficient of about 0.25.

11. The method of claim 1 wherein said second electrically insulative layer is sputtered at a reemission coefficient in the range of about 0.6 to 0.8.

12. The method of claim 1 wherein said insulative layer having a surface smoothness value of about 250 Å or less, peak to valley, is partially coated with material in the form of a raised pattern having a thickness of about 500 Å.

13. The method of claim 12 wherein said material is magnetic.

14. The method of claim 13 wherein said magnetic material is permalloy exhibiting an $H_{ce}$ of about 1.5 oe or less, an $H_k$ within the range of about 2.5 to 5.5 oe, and an $H_{ch}$ of about 1.5 oe or less, a $\beta$ of about 5° or less, and an $\alpha$ of about 10° or less.

15. The method of claim 12 wherein said insulative layer having a surface smoothness value of about 250 Å or less, peak to valley, is partially coated with metallic magnetic permalloy in the form of a raised line pattern having a thickness of about 500 Å and exhibiting an $H_{ce}$ of about 1.5 oe or less, an $H_k$ within the range of about 2.5 to 5.5 oe, an $H_{ch}$ of about 1.5 oe or less, a $\beta$ of about 5° or less, and an $\alpha$ of about 10° or less.

16. In the method of forming an electrically insulative coating having a surface smoothness value of about 250 Å or less, peak to valley, over a polycrystalline ferrite substrate, the steps of:
   RF bias sputtering a first substantially continuous layer of electrically insulative amorphous $Al_2O_3$ over said ferrite at a reemission coefficient of about 0.25;
   RF bias sputtering a second layer of electrically insulative $Al_2O_3$ over said first layer of electrically insulative amorphous $Al_2O_3$ at a reemission coefficient of about 0.7 to provide a surface smoothness value of about 250 Å or less, peak to valley.

17. In the method of forming an electrically insulative coating having a surface smoothness value of about 250 Å or less, peak to valley, over a substrate having a raised pattern having a thickness of about 500 Å, the steps of:
   RF bias sputtering a first substantially continuous layer of electrically insulative material over said substrate and raised pattern at a reemission coefficient of about 0.35 or lower; and then
   RF bias sputtering a second layer of said electrically insulative material over said first layer of said electrically insulative material at a reemission coefficient of about 0.6 or greater, to provide a surface smoothness value of about 250 Å or less, peak to valley.

18. The method of claim 17 wherein the raised pattern includes magnetic material, the first layer of electrically insulative material is sputtered at a reemission coefficient in the range of about 0.15 to 0.35, and is amorphous, and wherein said insulative material is selected from the group consisting of $Al_2O_3$, $SiO_2$, and $Si_3N_4$.

19. The method of claim 18 wherein said magnetic material is permalloy exhibiting an $H_{ce}$ of about 1.5 oe or less, an $H_k$ within the range of about 2.5 to 5.5 oe, and an $H_{ch}$ of about 1.5 oe or less, a $\beta$ of about 5° or less, and an $\alpha$ of about 10° or less.

20. The method of claim 19 wherein a magnetic head is formed by forming conductive connections to said permalloy, coating said permalloy and conductive connections with insulation, and placing additional ferrite on the insulation to form a magnetic head.

21. The method of claim 17 wherein the reemission coefficient for sputtering of the second layer is no greater than 0.8.

22. The method of claim 17 wherein the reemission coefficient for sputtering the first layer is at least 0.15.

* * * * *